(12) United States Patent
Coppola et al.

(10) Patent No.: US 10,102,470 B2
(45) Date of Patent: Oct. 16, 2018

(54) METHOD FOR MANUFACTURING AN ELECTRICAL CIRCUIT BOARD, ELECTRICAL CIRCUIT BOARD OBTAINED BY THIS METHOD AND SMART CARD COMPRISING SUCH AN ELECTRICAL CIRCUIT BOARD

(71) Applicant: Linxens Holding, Mantes la Jolie (FR)

(72) Inventors: Mara Coppola, Evreux (FR); Yannick De Maquille, Paris (FR); Fabien Marcq, Lezoux (FR)

(73) Assignee: Linxens Holding, Mantes la Jolie (FR)

( * ) Notice: Subject to any disclaimer, the term of this patent is extended or adjusted under 35 U.S.C. 154(b) by 0 days.

(21) Appl. No.: 15/242,676

(22) Filed: Aug. 22, 2016

(65) Prior Publication Data

US 2017/0061273 A1 Mar. 2, 2017

(30) Foreign Application Priority Data

Aug. 27, 2015 (FR) ..................................... 15 57974

(51) Int. Cl.

| | |
|---|---|
| *G06K 19/06* | (2006.01) |
| *G06K 19/077* | (2006.01) |
| *H01L 23/498* | (2006.01) |
| *H05K 1/02* | (2006.01) |
| *H05K 1/11* | (2006.01) |
| *H05K 1/18* | (2006.01) |
| *H05K 3/07* | (2006.01) |
| *H05K 3/10* | (2006.01) |
| *H05K 3/22* | (2006.01) |

(52) U.S. Cl.
CPC ..... *G06K 19/0776* (2013.01); *G06K 19/07743* (2013.01); *G06K 19/07747* (2013.01); *G06K 19/07769* (2013.01); *H01L 23/49855* (2013.01); *H05K 1/0296* (2013.01); *H05K 1/111* (2013.01); *H05K 1/118* (2013.01); *H05K 1/18* (2013.01); *H05K 3/07* (2013.01); *H05K 3/103* (2013.01); *H05K 3/22* (2013.01); *H05K 2201/0112* (2013.01)

(58) Field of Classification Search
CPC .......... G06K 19/06; G06K 5/00; G06K 19/00; G06K 7/08; G06F 17/00
USPC ................ 235/493, 380, 375, 487, 492, 449
See application file for complete search history.

(56) References Cited

U.S. PATENT DOCUMENTS 5,688,573 A * 11/1997 Goeb ................. C08G 18/4063
                                                       283/81
6,459,588 B1 * 10/2002 Morizumi ........ G06K 19/07749
                                                       235/492

(Continued)

FOREIGN PATENT DOCUMENTS

DE        195 23 242 A1     1/1997
FR        2 777 506        10/1999

*Primary Examiner* — Edwyn Labaze
(74) *Attorney, Agent, or Firm* — Harrington & Smith

(57) ABSTRACT

The invention relates to a method for manufacturing an electrical circuit board. It includes the provision of a sheet of electrically conductive material and a layer of adhesive material. In order to have a color appear in spaces cut or etched into the sheet of electrically conductive material, the adhesive material includes a coloring agent. The invention also relates to an electrical circuit board for a smart card, which circuit board is manufactured using this method, and a smart card including such an electrical circuit board.

12 Claims, 2 Drawing Sheets

(56) References Cited

U.S. PATENT DOCUMENTS

| | | | | |
|---|---|---|---|---|
| 2003/0132302 A1* | 7/2003 | Hattori | ............ | G06K 19/07749 235/492 |
| 2005/0094274 A1* | 5/2005 | Souparis | ................ | G06K 19/16 359/586 |
| 2005/0257880 A1* | 11/2005 | Herring | ............... | B32B 38/1841 156/230 |
| 2007/0231587 A1* | 10/2007 | Naito | ....................... | H01J 11/10 428/457 |
| 2009/0004442 A1* | 1/2009 | Danner | .................. | B32B 37/24 428/195.1 |
| 2009/0322538 A1* | 12/2009 | Kobren | ................... | C23C 28/00 340/572.8 |
| 2010/0147958 A1* | 6/2010 | Martinent | ............ | G06K 19/027 235/492 |
| 2011/0036914 A1* | 2/2011 | Shingu | ............. | G06K 19/07749 235/492 |
| 2011/0290892 A1* | 12/2011 | Ozawa | ................ | B42D 25/328 235/488 |
| 2014/0209691 A1* | 7/2014 | Finn | ................ | G06K 19/07769 235/492 |
| 2015/0041546 A1* | 2/2015 | Herslow | ................ | G06K 19/02 235/492 |
| 2015/0109651 A1* | 4/2015 | Branda | .................... | G02F 1/17 359/238 |
| 2015/0242740 A1* | 8/2015 | Dehouwer | ............. | G06K 7/081 235/451 |

* cited by examiner

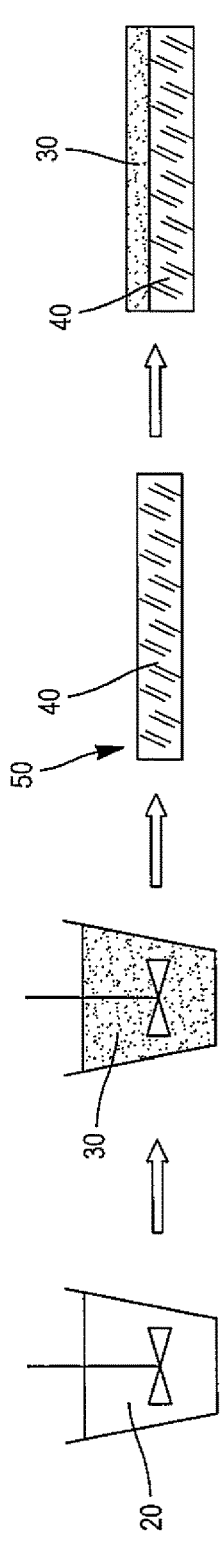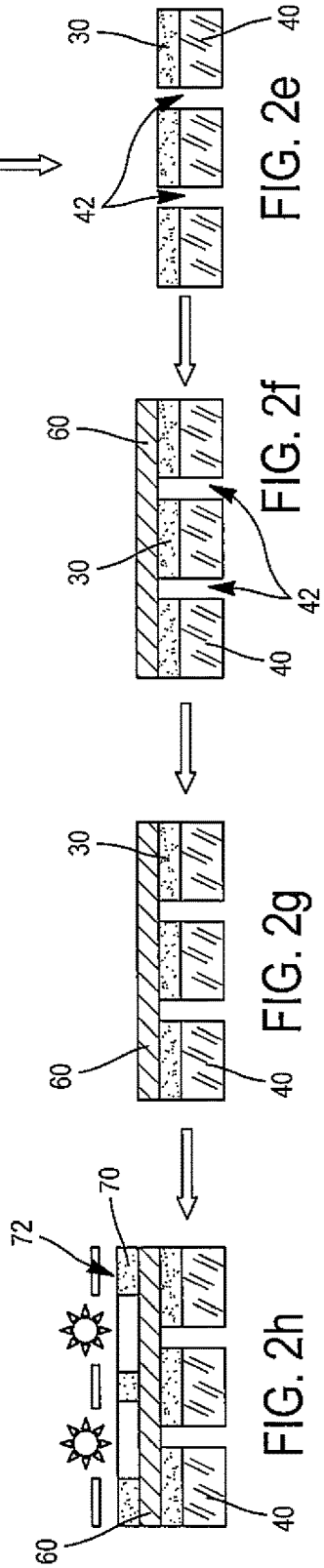

METHOD FOR MANUFACTURING AN ELECTRICAL CIRCUIT BOARD, ELECTRICAL CIRCUIT BOARD OBTAINED BY THIS METHOD AND SMART CARD COMPRISING SUCH AN ELECTRICAL CIRCUIT BOARD

The invention relates to the field of electrical circuit boards, such as printed circuit boards. Such printed circuit boards may, for example, be flexible and used to produce electronic modules for smart cards.

The invention is illustrated below using the example of electronic modules for smart cards, but it is easily transferable to other applications of rigid or flexible printed circuit boards.

Smart cards are well known to the public, who makes multiple uses thereof: credit cards, travel cards, identity cards, etc.

Figure 1:
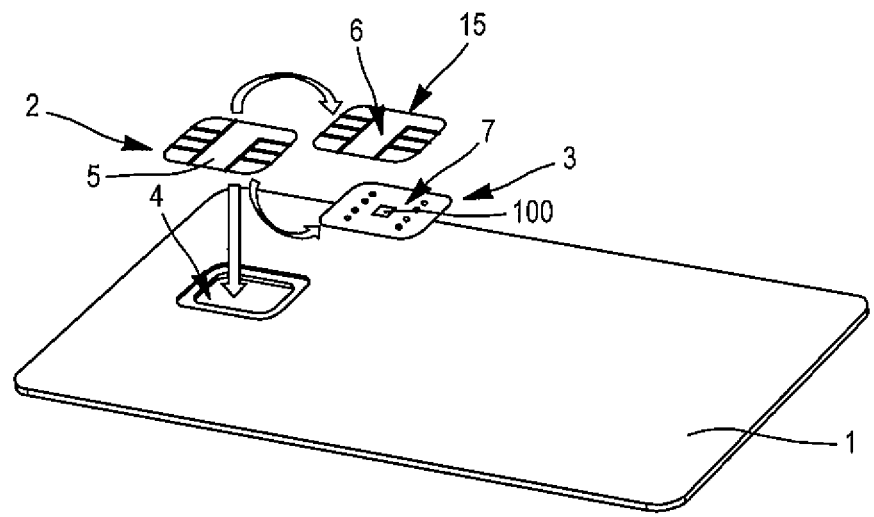

As shown in FIG. 1, smart cards are generally composed of a rigid carrier 1 made of a plastic material of PVC, PVC/ABS or polycarbonate type forming the main body of the card, with a cavity 4 into which a separately produced electronic module 2 is incorporated. This electronic module 2 comprises a generally flexible printed circuit board 3 equipped with an electronic chip 100 (integrated circuit) and transmission means for transmitting data from the chip to a card reader device (read) or from this device to the card (write). These data transmission means may be "contact" means, "contactless" means or indeed "dual" means when they combine the two preceding means. In a "contact" smart card, a connector 5 comprises contact lands 15 that are electrically connected to the chip 100 and flush with the surface of the card carrier 1, for a connection by electrical contact with a card reader device. In a "dual" smart card, in addition to the connector 5, at least one antenna is provided, generally in the card body, for a contactless connection with a card reader device.

In the prior art, the smart card modules 2 are generally formed from a dielectric substrate that is covered, on at least one of its sides 6, 7, by a sheet of electrically conductive material that is composed, for example, of a metal such as copper, steel or aluminium, or an alloy of one of these metals. Conductive tracks that form, at least in the case of some thereof, the electrical contact lands 15 are produced in this sheet of electrically conductive material. The dielectric substrates widely used in the prior art are made of composite materials (glass epoxy) or of plastic materials (PET, PEN, polyimide, etc.). This type of dielectric substrate is generally thin (its thickness is, for example, of the order of 100 μm) in order to retain a flexibility that is compatible with roll-to-roll methods for manufacturing electronic modules.

The method for manufacturing this type of electrical circuit board then comprises, for example:
- the provision of a sheet of electrically conductive material, which therefore has a first and a second main side;
- the provision of a layer of adhesive material;
- the placing in contact of one of the main sides of the layer of electrically conductive material with the layer of adhesive material; and
- the lamination of the sheet of electrically conductive material onto the layer of adhesive material.

A layer of dielectric material is generally used as the substrate, but the layer of adhesive material may, under certain conditions, be enough to form a dielectric substrate itself. When a layer of dielectric material is used, a step of coating one of the main sides of the layer of dielectric material with the adhesive material is carried out, in order to form the layer of adhesive material on the layer of dielectric material. The sheet of electrically conductive material is then placed in contact with the layer of adhesive material previously deposited onto the layer of dielectric material, and the assembly thus formed is subsequently laminated.

For certain applications, and in particular in the production of smart cards, it may be advantageous to obtain a visible colour in spaces cut or etched into the sheet of electrically conductive material. This colour may have a purely aesthetic function, but may also mask elements potentially positioned under the module and which would be visible between the contacts or other patterns formed in the sheet of electrically conductive material if the substrate were transparent.

To this end, the use of a dyed dielectric substrate has been proposed, but substrate suppliers, for which dyed substrates do not necessarily correspond to their standard products, are reluctant to multiply the number of their products in order to broaden the colour palette offered to their clients.

One aim of the invention is to overcome this drawback and to provide a simple means for obtaining numerous possible visible colours between at least certain areas cut or etched into the sheet of electrically conductive material.

Thus, it is proposed, according to the invention, to add a colouring agent (dye or pigment) to the adhesive material forming the layer of adhesive material, in order to form a layer of tinted or coloured adhesive material.

In this document, the following are referred to:
"dye", a material that is soluble in the medium, i.e. the adhesive material in this instance, into which it is introduced (it is said that a dye is dissolved in the medium);
"pigment", a material that is insoluble in the medium, i.e. the adhesive material in this instance, into which it is introduced (it is said that a pigment is dispersed in the medium).

As the layer of tinted adhesive is immediately subjacent to the sheet of electrically conductive material, its colour becomes visible between areas cut or etched into the latter, for example between conductive tracks, contacts, patterns forming logos, etc.

This method does not really modify the method of the prior art. Indeed, the layer of adhesive material is generally required. In particular, this method is much simpler than a method in which colour is added into spaces etched into the electrically conductive layer, after lamination and etching of the latter.

According to another aspect, the invention relates to an electrical circuit board comprising a sheet of electrically conductive material, with two main sides, and a layer of adhesive material in contact with one of the main sides of the layer of electrically conductive material, a colouring agent being added to the adhesive material forming the layer of adhesive material, in order to form a layer of tinted adhesive material.

According to another aspect, the invention relates to a smart card comprising a card body and a cavity made in the card body and in which an electronic module, itself comprising an electrical circuit board, is placed, with contacts that are flush with the surface of the card body and a colour that is visible on at least a portion of the surface of the module not occupied by the contacts, this colour being produced by a colouring agent present in a layer of adhesive subjacent to the contacts and added to an adhesive material in order to form a layer of tinted adhesive material.

The method, the electrical circuit board or the smart card according to the invention potentially comprises one or other of the features mentioned in the claims, considered individually or in combination.

Figure 3:
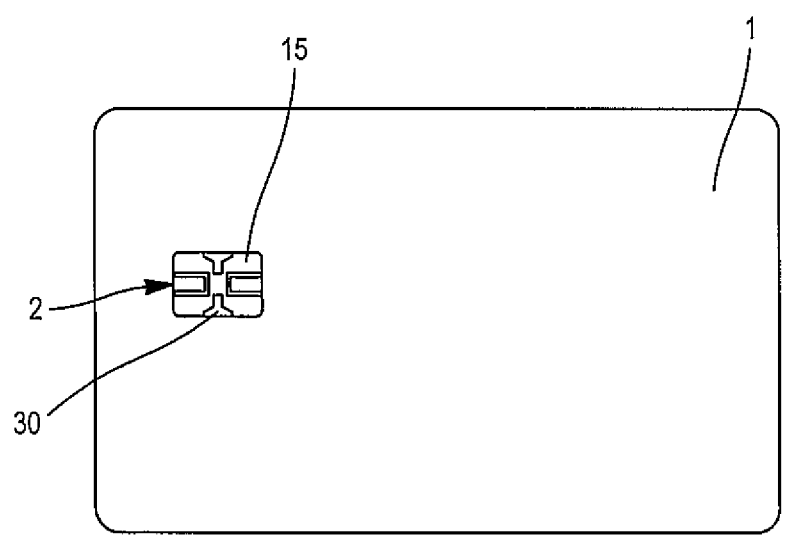

Other features and advantages of the invention will become apparent upon reading the detailed description and the appended drawings in which:

FIG. 1 is a schematic representation in perspective of a smart card intended to receive a module comprising an electrical circuit board;

FIGS. 2a to 2l schematically represent in succession the various steps of an exemplary method for manufacturing an electrical circuit board; and FIG. 3 is a schematic representation of an exemplary card with a module obtained via the method illustrated by FIGS. 2a to 2l.

An exemplary method for manufacturing an electrical circuit board according to the invention is described below. It belongs to the field of smart cards but, as already mentioned, what is described here may be easily transferred to applications in other fields (RFID antennas, LEDs, etc.).

As shown in FIG. 1, a smart card 1 comprises a module 2. The module 2 comprises a flexible electrical circuit board 3, equipped with a connector 5, and a chip 100. The module 2 is generally produced in the form of a separate element which is inserted into a cavity 4 made in the card 1.

The flexible electrical circuit board 3 therefore comprises a connector 5 with multiple contact lands 15 to which the chip 100 is connected. The flexible circuit board 3 is shown (above) from its front side 6 (contact side). It is also shown (below) from its back side 7, or bonding side. The flexible electrical circuit board 3 thus shown corresponds to a single-sided flexible electrical circuit board for a "contact" card. However, it could equally be a double-sided flexible electrical circuit board, for a "dual" card for example.

FIGS. 2a to 2l schematically illustrate various steps of an exemplary method according to the invention for manufacturing the flexible electrical circuit board 3.

This method comprises the provision (FIG. 2a) of an adhesive material or glue 20, in liquid form. The adhesive material 20 is, for example, composed of (potentially modified) epoxy. At this stage, the adhesive material 20 is naturally light yellow in colour and transparent.

In the following step (FIG. 2b), the pre-formulated adhesive material 20 is coloured by the addition of a colouring agent, an actual dye or a pigment. This colouring agent may dye the adhesive material 20 e.g. red, magenta, blue, green, orange, grey, black, etc. A dyed adhesive material 30 is obtained.

Examples of dyes are given in the table below:

| Colouring agent | Chemical family | Supplier |
|---|---|---|
| Orasol ® Red 365 | Metal complex | BASF ® |
| Pylam ® Solvent Red 24 Conc | Diazo | Pylam ® |
| Pylam ® Magenta LX-7042 | Anthraquinone | Pylam ® |
| Pylam ® Blue LX-9699 | Phthalocyanine; anthraquinone | Pylam ® |
| Pylakrome Bright Green LX-10687 | Anthraquinone; quinoline | Pylam ® |
| Pylakrome Orange LX-10113 | Azo | Pylam ® |

The concentrations used for the dyes vary between 0.5 and 5 phr (parts per hundred resin), i.e. between 0.5 and 5 percent by weight of colouring agent with respect to the solid resin(s) (hence without the solvents) that are present in the adhesive material 20.

The colouring agent may also be a pigment. It may then be a powdered pigment (or a mixture of multiple pigments) or a pre-dispersed pigment (again with one or more pigments).

Powdered pigments are to be dispersed in a medium. Their concentration in the medium is, for example, between 0.5 and 5 phr.

Pre-dispersed pigments take the form of products containing resins and/or solvents, one or more pigments, and potential dispersing agents, additives, etc. The composition of these pre-dispersed pigments varies depending on the product itself and/or its manufacturer. Pre-dispersed pigments are easy to use as they have only to be mixed into the adhesive material. The concentration of the pigments in pre-dispersed pigments may vary widely: e.g. 10% to 70% by weight of pigment in the pre-dispersed pigment.

Chromaflo is, for example, a supplier of pre-dispersed pigments. The reference Temacolor™ EP RM15 by Chromaflo is a red pre-dispersed pigment. Used at a concentration of 20 phr, it gives good results, without negatively affecting the properties of the adhesive material. More generally, the concentration of pre-dispersed pigment in the adhesive material may be made to vary from 1 to 50 phr (or even more).

Other examples of pigments and pre-dispersed pigments are given in the table below:

| Supplier | Product name | Physical state | Colour index (C.I.) | Chemistry |
|---|---|---|---|---|
| BASF ® | Orasol ® Microlith 3630K | Powdered pigment | Red 254 | Diketopyrrolopyrrole pre-dispersed in a vinyl copolymer resin |
| Chromaflo ™ | Temacolor ™ EP RM15 | Pre-dispersed pigment | Red 254 | Diketopyrrolopyrrole pre-dispersed in a liquid epoxy resin |
| | Temacolor ™ EP BM15 | | Blue 15:3 | Copper phthalocyanine pre-dispersed in a liquid epoxy resin |
| Protec ® | DecoTint ® Premium I Red 644 RB | Pre-dispersed pigment | Red 254 | Diketopyrrolopyrrole pre-dispersed in a solvent-based PGMA resin |
| | DecoTint ® Premium I Blue 675 BR | | Blue 15:4 | Copper phthalocyanine pre-dispersed in a solvent-based PGMA resin |
| Clariant(via Univar ®) | Hostatint Red A-P2Y 100-ST | Pre-dispersed pigment | Red 179 | Perylene pre-dispersed in a dibasic ester solvent |

| Supplier | Product name | Physical state | Colour index (C.I.) | Chemistry |
|---|---|---|---|---|
| | Hostatint Blue A-BTR 100-ST | | Blue 15:1 | Copper phthalocyanine pre-dispersed in a dibasic ester solvent |
| Trustchem | Pigment Red 254 | Powdered pigment | Red 254 | Diketopyrrolopyrrole |
| | Pigment Red 122 | | Red 122 | Quinacridone |
| | Pigment Blue 60 | | Blue 60 | Anthraquinone |

A layer of dielectric material 40, for forming a substrate 50, is provided (FIG. 2c). This dielectric material 40 is, for example, epoxy-glass. This dielectric material 40 may be grey, yellow or white in colour, for example. Its thickness is, for example, in the vicinity of 100 µm.

The layer of dielectric material 40 is next coated (FIG. 2d) with a tinted adhesive material 30 obtained in the step corresponding to FIG. 2b. The thickness of the layer of adhesive material 40 is, for example, between 10 and 70 µm after drying, and more preferably between 10 and 50 µm after drying, its thickness being, for example, 18 µm, plus or minus 3 µm.

After drying, the assembly composed of the layer of dielectric material 40 and the tinted adhesive material 30 is perforated all the way through (FIG. 2e), for example mechanically by punching, in order to form holes 42 corresponding to connection wells and, potentially, openings for receiving one or more electronic components.

A sheet of electrically conductive material 60 is placed in contact with the layer of adhesive material 30 (FIG. 2f). The sheet of electrically conductive material 60 covers the holes 42. The assembly composed of the sheet of electrically conductive material 60, of the layer of tinted adhesive material 30 and of the layer of dielectric material 40 is laminated. The layer of tinted adhesive material 30 is cured in an oven (FIG. 2g).

Resist patterns 72 are formed on the sheet of electrically conductive material 60 via photolithography, by depositing, exposing (FIG. 2h) and developing a light-sensitive resist 70 (FIG. 2i).

A step of etching patterns electrochemically allows patterns 62 to be formed in the sheet of electrically conductive material 60 (FIG. 2j). Spaces 64 between the various elements of the patterns 62 (contacts, logos) are etched into the sheet of electrically conductive material 60 and the layer of tinted adhesive material 30 is visible between these spaces 64.

The resist protecting the patterns 62 during etching is removed (FIG. 2k) and finishing layers 80 (nickel and gold for example) are potentially deposited onto the front side 6 via electrodeposition on at least a portion of the patterns 62 (FIG. 2l).

In steps that are not illustrated, a chip is fixed to the back of each module. Each chip is connected, for example via conductive wires, from the bottom of and through connection wells (like the holes 42), to contacts 15. The chip and the conductive wires are encapsulated and the modules are singulated and each one is individually transferred to a card cavity. The result is shown in FIG. 3. The colour of the tinted adhesive material 30 is visible between the contacts 15.

Numerous variants of the method described above may be envisaged. For example:
the method is implemented on a double-sided circuit board, instead of the single-sided circuit board of FIG. 2l; the circuit board then comprises a sheet of conductive material on each of the two opposite sides of the layer of dielectric material; in this case, the sheet of conductive material on one of the sides may correspond to that of a copper-clad laminate with a epoxy-glass dielectric substrate, for example; and/or instead of etching the sheet of conductive material 60 after having laminated it onto the layer of dielectric material 40, the patterns 62 are cut into a sheet of conductive material 60, before being transferred to the layer of dielectric material 40 (lead frame technology).

The invention claimed is:

1. Method for manufacturing an electrical circuit board designed to connect a chip to a conductive layer, the method comprising:
the provision of a layer of dielectric material having two main sides for forming a substrate;
the provision of a sheet of electrically conductive material, with two main sides;
the production of an electrical circuit pattern in the sheet of electrically conductive material;
the provision of a layer of adhesive material;
the placing in contact of one of the main sides of the layer of electrically conductive material with the layer of adhesive material; and
the lamination of the layer of dielectric material, the sheet of electrically conductive material and the layer of adhesive material,
wherein a colouring agent is added to the adhesive material forming the layer of adhesive material, in order to form a layer of tinted adhesive material;
wherein areas are cut or etched into the sheet of electrically conductive material between which the tinted adhesive is visible.

2. Method according to claim 1, comprising a step of coating one of the main sides of the layer of dielectric material with the tinted adhesive material before placing one of the main sides of the electrically conductive material in contact with the layer of tinted adhesive material that is positioned on the layer of dielectric material, and laminating the sheet of electrically conductive material with the layer of dielectric material.

3. Method according to claim 1, in which the colouring agent is a dye, a powdered pigment or a pre-dispersed pigment.

4. Method according to claim 1, in which the colouring agent represents between 0.5 and 50 phr of the adhesive material.

5. Method according to claim 1, in which the colouring agent belongs to at least one of the families of chemical compounds from the list composed of metal complexes, diazos, azos, anthraquinones, diketopyrrolopyrroles, phthalocyanines, perylenes, quinacridone, and quinolines.

6. Method according to claim 1, comprising a step of producing contacts in the sheet of electrically conductive material.

7. Method according to claim 6, in which the contacts are etched into the sheet of electrically conductive material by electrochemical etching.

8. Electrical circuit board comprising a sheet of electrically conductive material, with two main sides, an electrical circuit pattern in the sheet of electrically conductive material, and a layer of adhesive material in contact with one of the main sides of the sheet of electrically conductive material,
wherein a colouring agent is added to the adhesive material forming the layer of adhesive material, in order to form a layer of tinted adhesive material;
further comprising areas cut or etched into the sheet of electrically conductive material between which the tinted adhesive is visible.

9. Electrical circuit board according to claim 8, additionally comprising a layer of dielectric material, the layer of tinted adhesive material being placed between the layer of dielectric material and the sheet of electrically conductive material and maintaining adhesion between the layer of dielectric material and the sheet of electrically conductive material.

10. Electrical circuit board according to claim 8, in which the colouring agent represents between 0.5 and 50 phr of the adhesive material.

11. Electrical circuit board according to claim 8, in which the colouring agent belongs to at least one of the families of chemical compounds from the list composed of metal complexes, diazos, azos, anthraquinones, diketopyrrolopyrroles, phthalocyanines, perylenes, quinacridones, and quinolines.

12. Smart card comprising a card body and a cavity made in the card body and in which an electronic module, comprising an electrical circuit board according to claim 8, is placed, the electronic module comprising contacts flush with the surface of the card body and a colour that is visible on at least a portion of the surface of the module not occupied by the contacts, this colour being produced by a colouring agent present in a layer of adhesive subjacent to the contacts and added to an adhesive material in order to form the layer of tinted adhesive material.

* * * * *